(12) United States Patent
Ichiyama et al.

(10) Patent No.: US 8,045,605 B2
(45) Date of Patent: Oct. 25, 2011

(54) JITTER AMPLIFIER CIRCUIT, SIGNAL GENERATION CIRCUIT, SEMICONDUCTOR CHIP, AND TEST APPARATUS

(75) Inventors: Kiyotaka Ichiyama, Tokyo (JP); Masahiro Ishida, Tokyo (JP)

(73) Assignee: Advantest Corporation, Tokyo (JP)

( * ) Notice: Subject to any disclaimer, the term of this patent is extended or adjusted under 35 U.S.C. 154(b) by 735 days.

(21) Appl. No.: 11/616,010

(22) Filed: Dec. 25, 2006

(65) Prior Publication Data

US 2008/0151981 A1 Jun. 26, 2008

(51) Int. Cl.
*H04B 3/46* (2006.01)
*H04B 17/00* (2006.01)
*H04Q 1/20* (2006.01)

(52) U.S. Cl. ............ 375/226; 375/224; 375/231; 702/79

(58) Field of Classification Search .................. 375/224, 375/226, 231; 702/79
See application file for complete search history.

(56) References Cited

U.S. PATENT DOCUMENTS

| | | | | |
|---|---|---|---|---|
| 3,571,627 A * | 3/1971 | Cardon et al. | ................. | 327/119 |
| 5,327,021 A * | 7/1994 | Kanai et al. | ..................... | 327/74 |
| 5,487,016 A * | 1/1996 | Elms | ................ | 702/71 |
| 5,990,712 A * | 11/1999 | Corman et al. | ................. | 327/121 |
| 6,208,849 B1 * | 3/2001 | Cho et al. | ........................ | 455/296 |
| 7,154,962 B2 * | 12/2006 | Cangiani et al. | .............. | 375/295 |
| 2005/0093726 A1 * | 5/2005 | Hezar et al. | ................... | 341/143 |
| 2005/0122245 A1 * | 6/2005 | Frith et al. | ................... | 341/150 |
| 2005/0185708 A1 * | 8/2005 | Yamaguchi et al. | .......... | 375/224 |
| 2006/0044057 A1 * | 3/2006 | Hezar et al. | ..................... | 330/10 |
| 2006/0260639 A1 * | 11/2006 | Fani et al. | ......................... | 134/1 |
| 2007/0087704 A1 * | 4/2007 | Gilberton | .................. | 455/114.3 |
| 2007/0195905 A1 * | 8/2007 | Schatz | .......................... | 375/265 |

* cited by examiner

*Primary Examiner* — David C. Payne
*Assistant Examiner* — Erin File
(74) *Attorney, Agent, or Firm* — Sterne, Kessler, Goldstein & Fox P.L.L.C.

(57) ABSTRACT

There is provided a jitter amplifier circuit for amplifying jitter included in an input signal. The jitter amplifier circuit includes a distorting circuit that receives the input signal, and distorts a waveform of the input signal so as to generate a harmonic component of the input signal, and a filter that passes, out of the distorted signal output from the distorting circuit, a harmonic component of a certain order which is determined in accordance with an amplification ratio of amplifying the jitter.

7 Claims, 14 Drawing Sheets

JITTER AMPLIFIER CIRCUIT, SIGNAL GENERATION CIRCUIT, SEMICONDUCTOR CHIP, AND TEST APPARATUS

BACKGROUND

1. Technical Field

The present invention relates to a jitter amplifier circuit, a signal generation circuit, a semiconductor chip, and a test apparatus. More specifically, the present invention relates to a jitter amplifier circuit for amplifying jitter included in an input signal.

2. Related Art

Devices such as high-speed communication devices and high-speed serial I/O devices are tested for properties, including jitter tolerance testing. For example, it is stipulated to conduct a test by injecting jitter having a frequency of several hundred MHz to communication data according to recommendation of International Telecommunication Union Telecommunication Standardization Sector (ITU-T).

When a high-speed device under test (DUT) is actually used, jitter of a high-frequency component has a significant influence on the bit error. For this reason, it is desired to test the high-speed DUT by using a test apparatus which is capable of injecting jitter having a high frequency.

Here, jitter can be injected into a clock signal, for example, in such a manner that a signal corresponding to the jitter is injected into the control input of a voltage-controlled oscillator or the like which generates the clock signal. In this way, the frequency or phase of the clock signal is modulated, so that the jitter is injected into the clock signal. Also, the jitter can be injected into a data signal by supplying the clock signal including the jitter injected thereto as the driving clock of a pattern generator which generates the data signal.

Here, the jitter is injected into the clock signal by frequency- or phase-modulating the clock signal. Therefore, there is a problem that the frequency of the jitter which can be injected into the clock signal is limited to approximately several dozen MHz.

There is another method for injecting jitter into a signal, in which a variable delay circuit is provided on a transmission path for the signal. According to this method, the jitter can be injected into the transmission signal by controlling the time delay of the variable delay circuit in accordance with the jitter to be injected.

However, it takes a long time to vary the time delay of the variable delay circuit. Therefore, this method also has difficulties in injecting high-frequency jitter.

It may be possible to inject high-frequency jitter by using a high-speed operating variable delay circuit or the like. However, this poses a problem of an increased cost for the circuit.

In view of the above-mentioned problems, an advantage of some embodiments of the present invention is to provide a jitter amplifier circuit, a signal generation circuit, a semiconductor chip and a test apparatus which can solve the above-mentioned problems. This advantage is achieved by combining the features recited in the independent claims. The dependent claims define further effective specific example of the present invention.

SUMMARY

To solve the problems, a first embodiment of the present invention provides a jitter amplifier circuit for amplifying jitter included in an input signal. The jitter amplifier circuit includes a distorting circuit that receives the input signal, and distorts a waveform of the input signal so as to generate at least a harmonic component of the input signal, and a filter that passes, out of the distorted signal output from the distorting circuit, a harmonic component of a certain order which is determined in accordance with an amplification ratio of amplifying the jitter.

A second embodiment of the present invention provides a signal generation circuit for generating an output signal including jitter injected thereto. The signal generation circuit includes a reference signal generating section that generates a reference signal, a jitter injecting section that injects jitter into the reference signal output from the reference signal generating section, and a jitter amplifier circuit that receives the reference signal including the jitter injected thereto by the jitter injecting section, and amplifies the jitter included in the reference signal. Here, the jitter amplifier circuit includes a distorting circuit that receives the reference signal including the jitter injected thereto by the jitter injecting section, and distorts a waveform of the received reference signal so as to generate at least a harmonic component of the reference signal, and a filter that passes, out of the distorted signal output from the distorting circuit, a harmonic component of a certain order which is determined in accordance with an amplitude of the jitter to be injected into the output signal.

A third embodiment of the present invention provides a semiconductor chip for amplifying jitter included in an input signal. The semiconductor chip includes a distorting circuit that receives the input signal, and distorts a waveform of the input signal so as to generate at least a harmonic component of the input signal, and a filter that passes, out of the distorted signal output from the distorting circuit a harmonic component of a certain order which is determined in accordance with an amplification ratio of amplifying the jitter.

A fourth embodiment of the present invention provides a test apparatus for testing a device under test. The test apparatus includes a pattern generating section that generates a predetermined logic pattern, a signal generation circuit that generates a clock signal including jitter injected thereto, a waveform shaping section that generates a test signal by sampling the logic pattern in accordance with the clock signal, and inputs the generated test signal into the device under test, and a judging section that judges acceptability of the device under test based on a to-be-measured signal output from the device under test in response to the test signal. Here, the signal generation circuit includes a reference signal generating section that generates a reference signal, a jitter injecting section that injects jitter to the reference signal output from the reference signal generating section, and a jitter amplifier circuit that receives the reference signal including the jitter injected thereto by the jitter injecting section. Here, the jitter amplifier circuit includes a distorting circuit that receives the reference signal including the jitter injected thereto by the jitter injecting section, and distorts a waveform of the received reference signal so as to generate at least a harmonic component of the reference signal, and a filter that passes, out of the distorted signal output from the distort circuit, a harmonic component of a certain order which is determined in accordance with an amplitude of the jitter to be injected into the clock signal, so as to generate the clock signal.

Here, all the necessary features of the present invention are not listed in the summary. The sub-combinations of the features may become the invention.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
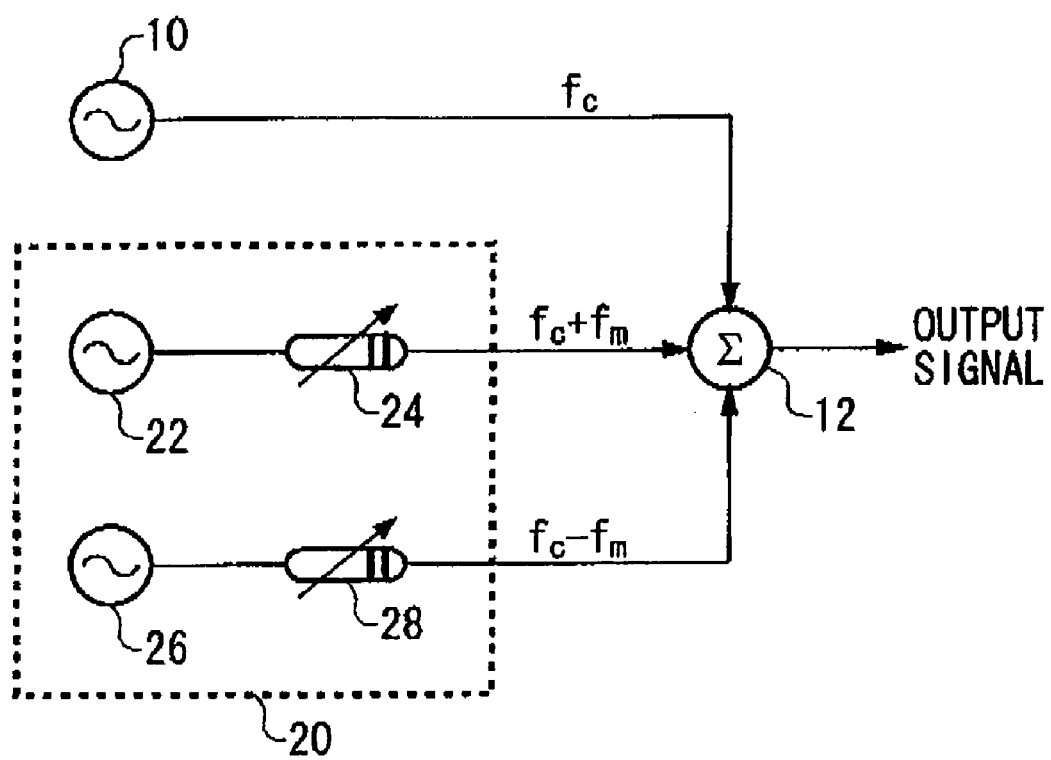
FIG. 1 shows one example of the configuration of a jitter injection circuit 100.

FIG. 1 shows one example of the configuration of a jitter injection circuit 100. The jitter injection circuit 100 generates an output signal including jitter injected thereto. The jitter injection circuit 100 includes therein a carrier output section 10, a jitter output section 20, and an adding section 12.

The carrier output section 10 outputs a carrier signal having a predetermined frequency which is equal to a carrier frequency fc to be possessed by the output signal. For example, the carrier output section 10 may be an oscillator circuit which outputs a sinusoidal wave having the carrier frequency fc.

The jitter output section 20 outputs a first jitter signal and a second jitter signal. The first jitter signal has a frequency (fc+fm) obtained by adding a jitter frequency fin to be possessed by jitter included in the output signal to the carrier frequency fc. The second jitter signal has a frequency (fc−fm) obtained by subtracting the jitter frequency fm from the carrier frequency fc.

Which is to say, the jitter output section 20 outputs the first and second jitter signals which respectively have different frequencies. The carrier signal output from the carrier output section 10 has a frequency positioned in substantially the middle between the frequencies of the first and second jitter signals.

According to the present embodiment, the jitter output section 20 includes therein a first oscillator 22, a second oscillator 26, a first variable delay section 24, and a second variable delay section 28. The first oscillator 22 may be an oscillator circuit that outputs a sinusoidal wave having the frequency (fc+fm) as the first jitter signal. The second oscillator 26 may be an oscillator circuit that outputs a sinusoidal wave having the frequency (fc−fm) as the second jitter signal. The first oscillator may be assigned in advance the frequency (fc+fm) obtained by adding together the carrier frequency and jitter frequency, and the second oscillator may be assigned in advance the frequency (fc−fm) obtained by subtracting the jitter frequency from the carrier frequency.

The carrier output section 10, first oscillator 22 and second oscillator 26 may be respectively constituted by using a voltage-controlled oscillator, for example. The voltage-controlled oscillator is a circuit for outputting an oscillation signal having a frequency determined in accordance with a control signal supplied thereto. In other words, the carrier output section 10, first oscillator 22 and second oscillator 26 may be respectively circuits which can control the frequency of the output thereof in accordance with the assigned carrier frequency fc and jitter frequency fm.

The first and second variable delay sections 24 and 28 respectively delay the first and second jitter signals, to adjust the relative phase among the first jitter signal, second jitter signal and carrier signal. For example, the respective time delays of the first and second variable delay sections 24 and 28 may be adjusted in advance so that the first and second jitter signals are substantially synchronized to each other. In other words, the time delays may be adjusted in advance so that the timing of the phase "0" of the first jitter signal substantially coincides with the timing of the phase "0" of the second jitter signal. Here, the timing of the phase "0" may be the timing at which the waveform of the signal reaches a maximum value, for example. Note that the carrier signal, first jitter signal and second jitter signal may be added together by using a cosine function as explained later with reference to expressions (5) and (6). In this way, the waveform of the jitter injected can be prevented from being distorted.

The time delays of the first and second variable delay sections 24 and 28 may be adjusted in advance so that the relative phase between the carrier signal and the first and second jitter signals which are substantially synchronized to each other takes on a predetermined value. In this way, the relative phase between the jitter and carrier can be adjusted. If the relative phase of the jitter signals with respect to the carrier signal can take on any value, what is required is only that the phases are adjusted between the jitter signals. In this case, one of the first and second variable delay sections 24 and 28 may be omitted.

The adding section 12 adds together the first jitter signal, second jitter signal and carrier signal, to generate the output signal. The adding section 12 may add together the waveforms of the first jitter signal, second jitter signal and crier signal.

Configured in the above-described manner, the Jitter injection circuit 100 can generate a signal including a sinusoidal jitter having a frequency of fm injected thereto. The following describes that the output signal from the adding section 12 is a signal including sinusoidal jitter having a frequency fm injected thereto.

Figure 2:
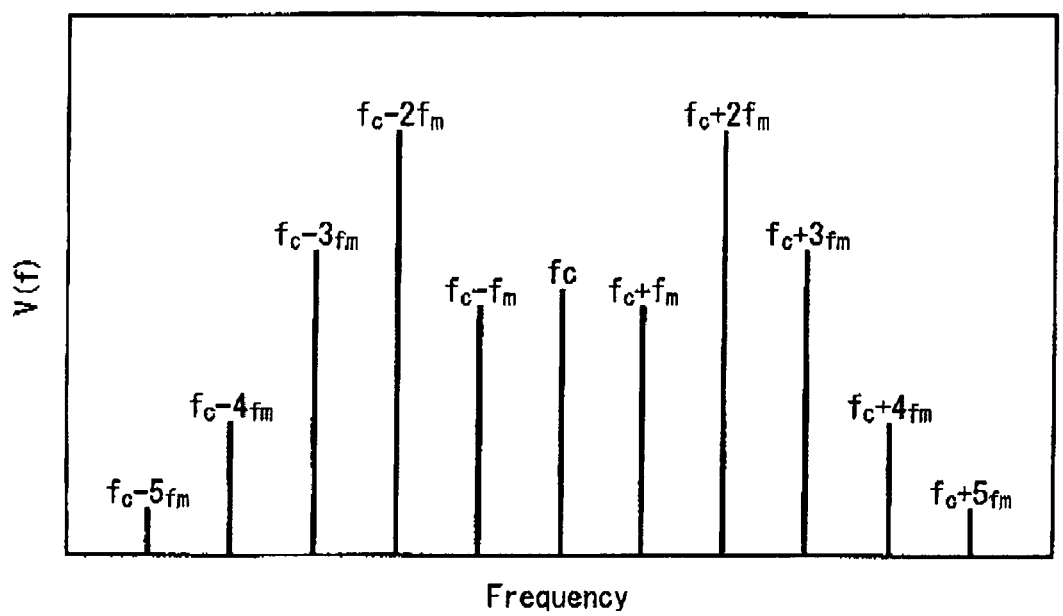
FIG. 2 shows one example of the spectrum of a signal including sinusoidal jitter injected thereto.

FIG. 2 shows one example of the spectrum of the signal including the sinusoidal jitter injected thereto. The fundamental frequency component of the signal u(t) including the sinusoidal jitter injected thereto can be represented by the following expression.

$$u(t)=A_c \cos(2\pi f_c t+\beta \cos(2\pi f_m t)) \qquad \text{Expression (1)}$$

Here, $A_c$ denotes the value of the amplitude of the signal u(t), $f_c$ denotes the carrier frequency, $\beta$ denotes the value of the amplitude of the jitter component, and $f_m$ denotes the jitter frequency.

By performing series expansion on the expression (1), the following expression can be obtained.

$$u(t) = \sum_{n=-\infty}^{\infty} A_C J_n(\beta)\cos(2\pi(f_C + nf_m)t) \qquad \text{Expression (2)}$$

It should be noted here that $J_n(\beta)$ is a Bessel function of the first kind of the n-th order. Therefore, the spectrum U(f) of the signal u(t) can be represented by the following expression.

$$U(f) = \sum_{n=-\infty}^{\infty} A_C J_n(\beta)\delta(f - (f_C + nf_m)) \qquad \text{Expression (3)}$$

Here, $\delta$ denotes a delta function.

Based on the foregoing description, the signal including the sinusoidal jitter injected thereto has a spectrum shown in FIG. 2 which peaks at the frequencies of $f_c+kf_m$ and $f_o-kf_m$ (here, k is any natural number). Accordingly, the signal including the sinusoidal jitter injected thereto can be generated by adding together the waveforms of the signals which peak at the above-mentioned frequencies.

Referring to the integer n, the Bessel function satisfies a relation represented by the following expression.

$$J_{-n}(\beta)=(-1)^n J_n(\beta) \qquad \text{Expression (4)}$$

By transforming the expression (2) based on this expression, the following expression is obtained.

$$u(t) = A_C J_0(\beta)\cos(2\pi f_C t) + A_C \sum_{n=1}^{\infty} J_n(\beta) \qquad \text{Expression (5)}$$
$$[\cos(2\pi(f_C + nf_m)t) + (-1)^n \cos(2\pi(f_C - nf_m)t)]$$

Figure 3:
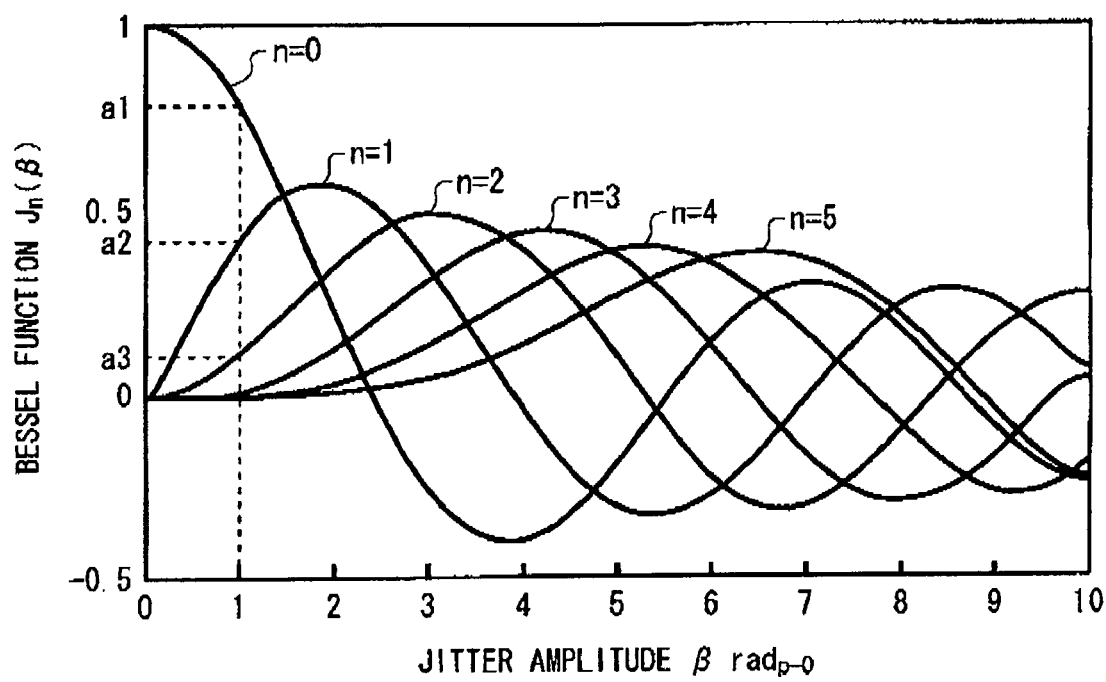
FIG. 3 shows Bessel functions of the first kind of the zeroth order to fifth order.

FIG. 3 shows Bessel functions of the first kind of the zeroth order to fifth order. As shown in FIG. 3, when the jitter amplitude is sufficiently small, for example, when the amplitude of the jitter $\beta$ is equal to approximately 0.1, the values of the Bessel functions of the second order and higher are respectively substantially zero. In other words, when the jitter amplitude is sufficiently small, the following approximation can be established based on the expression (5).

$$u(t) \approx A_c J_0(\beta) \cos(2\pi f_c t)+A_c J_1(\beta)[\cos(2\pi(f_c+f_m)t)-\cos(2\pi(f_c-f_m)t)] \qquad \text{Expression (6)}$$

The expression (6) indicates that when the amplitude of the jitter to be injected is sufficiently small, the output signal including the sinusoidal jitter injected thereto can be generated in such a manner that the carrier signal having the carrier frequency of fc, the first jitter signal having the frequency (fc+fm), and the second jitter signal having the frequency (fc−fm) are added together as illustrated with reference to FIG. 1.

The expression (6) also indicates that the jitter injection circuit 100 preferably controls the amplitudes of the carrier signal, first jitter signal and second jitter signal so that the ratio between the amplitude of the carrier signal and the amplitude of the first and second jitter signals is equal to $J_0(\beta)/J_1(\beta)$. As shown in FIG. 3, the signal having a desired jitter amplitude can be generated in such a manner that the amplitude ratio is adjusted in accordance with the amplitude $\beta$ of the jitter to be injected. How to control the amplitudes is described later with reference to FIG. 5.

If the amplitude $\beta$ of the jitter to be generated is such that the value of a Bessel function of a higher order can not be ignored, the jitter injection circuit 100 may additionally generate a pair of the first and second jitter signals corresponding to the Bessel function of the higher order. This alternative configuration is later described with reference to FIG. 6.

The jitter injection circuit 100 can inject jitter having a desired frequency into the carrier signal, by generating jitter signals having a frequency determined in accordance with the desired frequency of the jitter to be injected. Which is to say, the jitter injection circuit 100 can inject jitter having a frequency in a frequency range which can be generated by the oscillators. Therefore, the jitter injection circuit 100, which can inject high-frequency jitter, can be obtained with ease and at a low cost.

Figure 4:
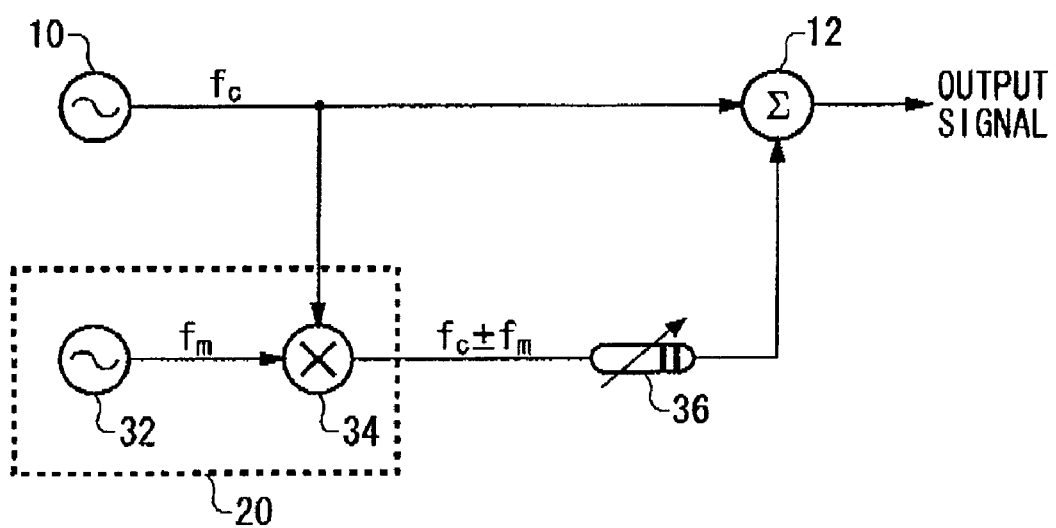
FIG. 4 shows another example of the configuration of the jitter injection circuit 100.

FIG. 4 shows another example of the configuration of the jitter injection circuit 100. According to the present embodiment, the jitter injection circuit 100 includes therein the carrier output section 10, adding section 12, jitter output section 20 and a variable delay section 36. The carrier output section 10 and adding section 12 may have the same functions and configurations as the carrier output section 10 and adding section 12 described with reference to FIG. 1.

The jitter output section 20 includes therein a local oscillator 32 and a mixer 34. The local oscillator 32 is assigned in advance the frequency $f_m$ of the jitter to be injected, and outputs a local signal having the assigned frequency. The local oscillator 32 may be a voltage-controlled oscillator or the like which can control the frequency of the output thereof in accordance with the jitter frequency fm assigned thereto.

The mixer 34 receives the carrier signal which is output from the carrier output section 10 and split and multiplies together the carrier signal and local signal. In other words, the mixer 34 outputs a signal having a signal component with the frequency $(f_c+f_m)$ and a signal component with the frequency $(f_c-f_m)$. Here, these signal components respectively correspond to the first and second jitter signals described with reference to FIG. 1.

The variable delay section 36 delays the signal output from the mixer 34 so as to adjust the relative phase between the signal output from the mixer 34 and the carrier signal. For example, the time delay of the variable delay section 36 may be adjusted in advance so that the relative phase difference between the signal output from the mixer 34 and the carrier signal takes on a predetermined value. In the present embodiment, the first and second jitter signals are substantially synchronized to each other. Therefore, if the relative phase between the carrier signal and jitter signal is allowed to take on any value, the variable delay section 36 may be omitted.

The adding section 12 adds together the waveform of the signal output from the variable delay section 36 and the waveform of the carrier signal. The jitter injection circuit 100 having the above-described configuration can also generate the output signal including a high-frequency jitter injected thereto with ease and at a low cost similarly to the jitter injection circuit 100 described with reference to FIGS. 1 to 3.

According to the jitter output section 20 relating to the present embodiment, the single local oscillator 32 generates the frequency to be included in the frequencies of both the first and second jitter signals, and the mixer 34 generates the frequency components corresponding to the first and second jitter signals. In this manner, the offset frequency $f_m$ with respect to the carrier frequency $f_c$ can be made accurately the same in the frequency components corresponding to the first and second jitter signals. Also, the frequency $f_c$ of the carrier signal can be positioned accurately in the middle between the frequencies of the first and second jitter signals. Therefore, the jitter injection circuit 100 relating to the present embodiment can generate a signal having a spectrum which accurately matches the spectrum shown in FIG. 2. In other words, the jitter injection circuit 100 relating to the present embodiment can generate the output signal including accurate sinusoidal jitter injected thereto. In addition, only one variable delay section 36 is required since the first and second jitter signals are transmitted by using the signal transmission path, which can reduce the circuit scale.

Figure 5:
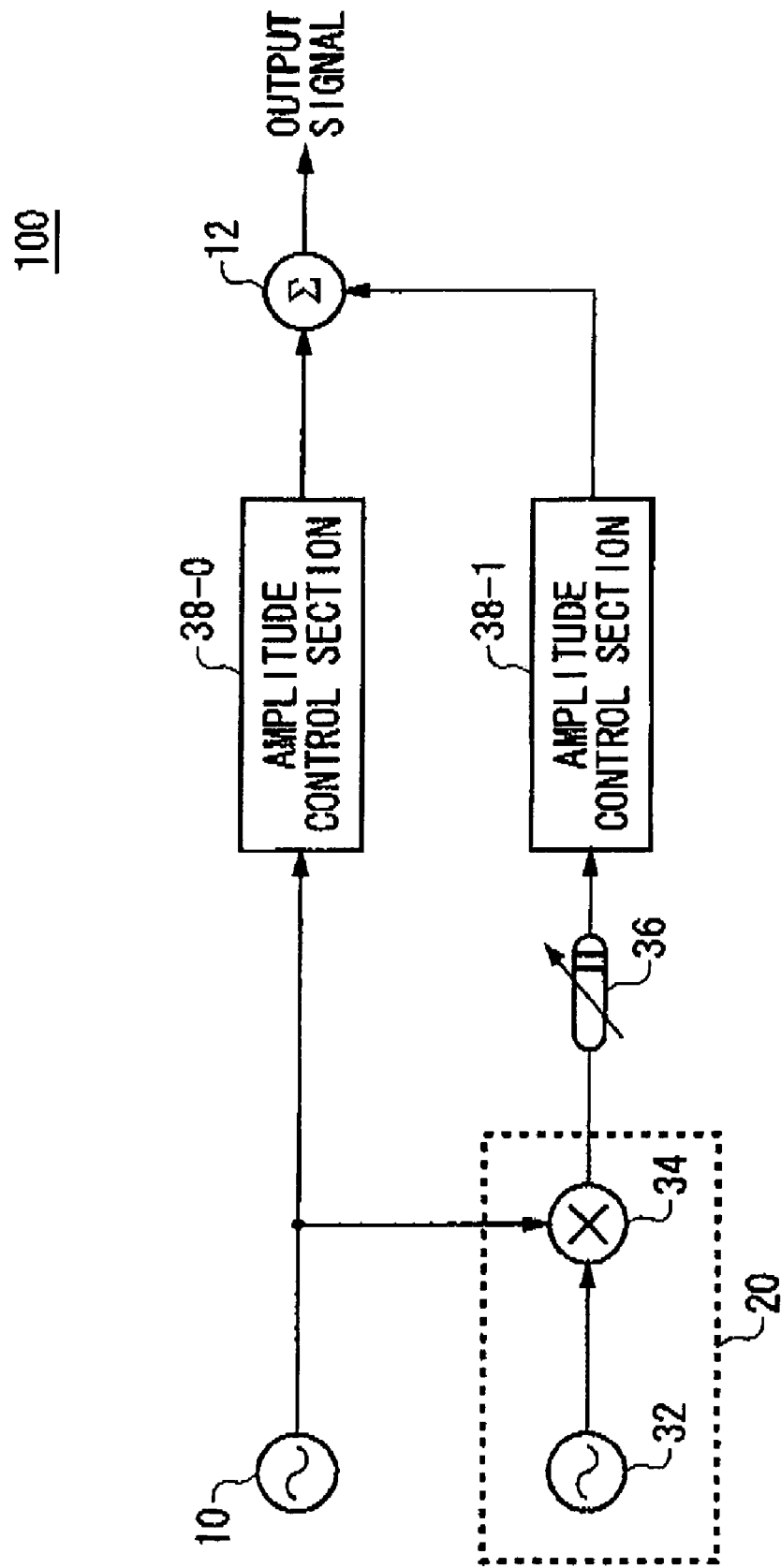
FIG. 5 shows another example of the configuration of the jitter injection circuit 100.

FIG. 5 shows another example of the configuration of the jitter injection circuit 100. According to the present embodiment, the jitter injection circuit 100 includes therein amplitude control sections (38-0 and 38-1, hereinafter collectively referred to as an amplitude control section 38) in addition to the constituents of the jitter injection circuit 100 described with reference to one of FIGS. 1 and 4. The jitter injection circuit 100 shown in FIG. 5 is constituted by adding the amplitude control section 38 to the jitter injection circuit 100 shown in FIG. 4.

The amplitude control section 38 controls the amplitude ratio of the carrier signal to the first and second jitter signals which are all input into the adding section 12, in accordance with the amplitude β of the jitter to be injected, as explained with reference to FIG. 3. Here, the jitter amplitude β is an amplitude measured in terms of time (or phase) as indicated by the expression (1), and the amplitudes controlled by the amplitude control section 38 are the amplitudes measured in terms of the signal level (e.g. voltage).

It is assumed that the jitter output section 20 outputs one pair of first and second jitter signals as shown in FIG. 5, for example. As described with reference to FIGS. 2 and 3, when the amplitude of the carrier signal is $A_c J_0(\beta)$, and the amplitude of the first and second jitter signals is $A_c J_1(\beta)$, the output signal, which is generated by adding together the carrier signal, first jitter signal and second jitter signal includes jitter having the amplitude β injected thereto. In other words, when the amplitude ratio of the carrier signal to the first and second jitter signals is $J_0(\beta)/J_1(\beta)$, the output signal includes the jitter having the amplitude β injected thereto.

To put it differently, the amplitude control section 38 may control the amplitude ratio so as to be substantially equal to the ratio between the value of the Bessel function of the zeroth order $J_0(\beta)$ and the value of the Bessel function of the first order $J_1(\beta)$, where the values are obtained by assigning the amplitude β of the jitter to be injected to the variables of the Bessel functions. According to such a control, the output signal can include the jitter having the amplitude β injected thereto.

For example, it is assumed that jitter having an amplitude 1 $\text{rad}_{p\text{-}0}$ in terms of the phase is injected. In this case, the amplitude control section 38 may control the amplitudes of the carrier signal, first jitter signal and second jitter signal so that the amplitude ratio becomes equal to $a_1/a_2$, as shown in FIG. 3. The amplitude control section 38 may be formed by using an amplifier, or a circuit to control the carrier output section 10 and jitter output section 20 so as to control the amplitudes of the signals.

According to the foregoing description of the present embodiment, the jitter output section 20 outputs one pair of the first and second jitter signals. However, the jitter output section 20 outputs an additional pair of jitter signals corresponding to a Bessel function of a higher order when jitter having a relatively large amplitude is required to be generated. In this case, the amplitude control section 38 may also control the amplitudes of the signals so that the amplitude ratio among the signals becomes substantially equal to the ratio among the values of the Bessel functions of the orders corresponding to the signals.

For example, when jitter having an amplitude of 1 $\text{rad}_{p\text{-}0}$ in terms of the phase is injected, the Bessel function of the second order can not be ignored as indicated by FIG. 3. Therefore, it is preferable that the jitter output section 20 additionally outputs a first jitter signal having a frequency $(f_c+2f_m)$ and a second jitter signal having a frequency $(f_c-2f_m)$ which correspond to the Bessel function of the second order. In this case, the amplitude control section 38 may control the amplitudes of the signals so that the ratio among the amplitude of the carrier signal, the amplitude of the first jitter signal $(f_c+f_m)$ and second jitter signal $(f_c-f_m)$, and the amplitude of the first jitter signal $(f_c+2f_m)$ and second jitter signal $(f_c-2f_m)$ becomes equal to $J_0(\beta):J_1(\beta):J_2(\beta)=a_1:a_2:a_3$ (note that β=1).

Figure 6:
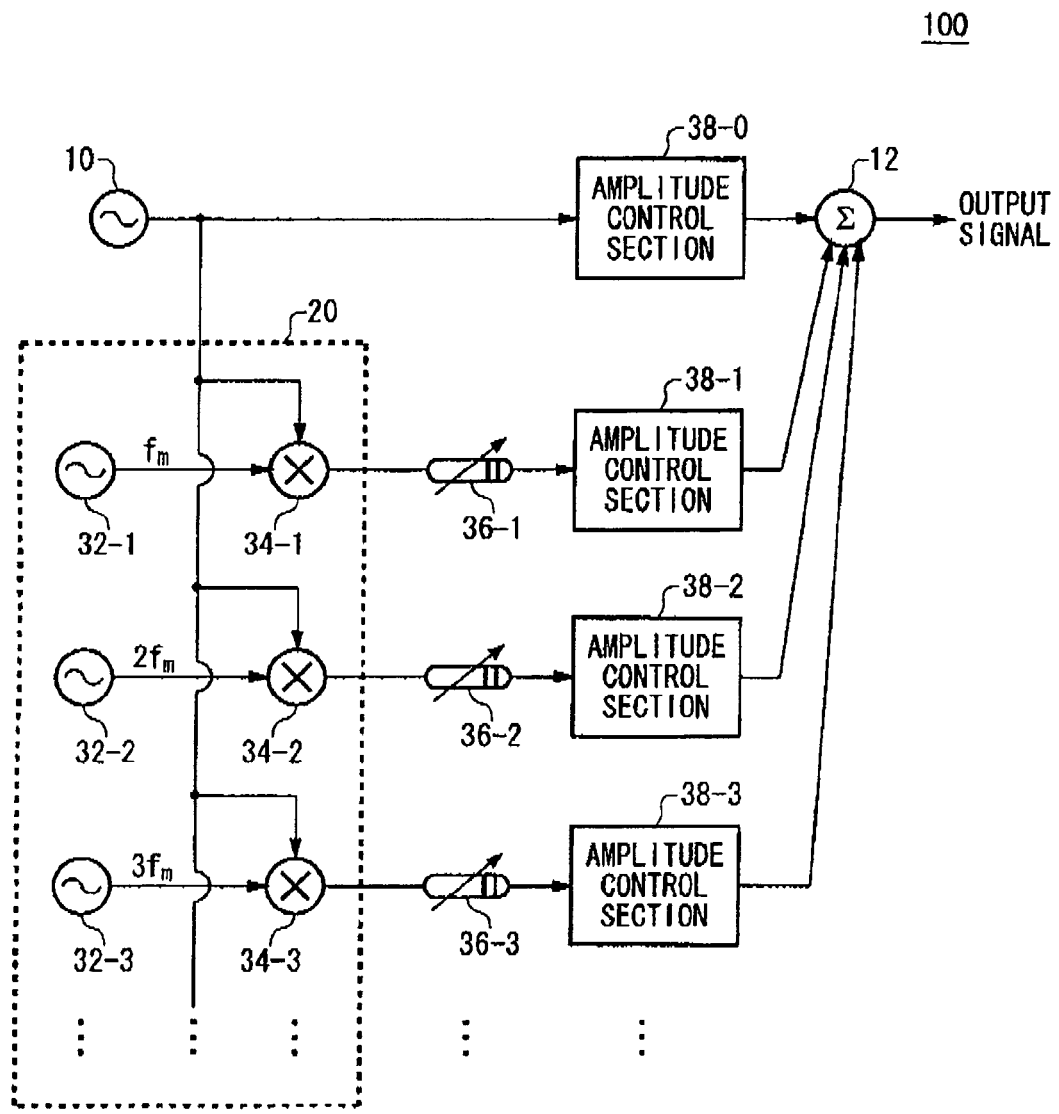
FIG. 6 shows another example of the configuration of the jitter injection circuit 100.

FIG. 6 shows another example of the configuration of the jitter injection circuit 100. According to the present embodiment, the jitter injection circuit 100 includes therein a plurality of combination circuits, in parallel, each of which is constituted by combing the local oscillator 32, mixer 34, variable delay section 36 and amplitude control section 38. In the following description, the combination circuits of the first, second, . . . k-th, . . . stages are respectively referred to as first-, second-, . . . k-th-, . . . order circuits (here k is an integer).

The local oscillator 32-$k$ in the k-th-order combination circuit outputs a local signal having a frequency of $kf_m$. In the following description, the local signal having the frequency of $kf_m$ is referred to as k-th-order local signal.

Each of the mixers 34 multiplies together the local signal received from a corresponding one of the local oscillators 32 and the carrier signal, and outputs the result of the multiplication. Each mixer 34 may be supplied the carrier signal which is split. Summing up, the k-th-order mixer 34 outputs a k-th-order first jitter signal having a frequency equal to the result of adding together the Tier frequency $f_c$ and the k-fold of the jitter frequency $f_m$, and a k-th-order second jitter signal having a frequency equal to the result of subtracting the k-fold of the jitter frequency $f_m$ from the carrier frequency $f_c$.

Each of the variable delay sections 36 delays the signal output from a corresponding one of the mixers 34, to adjust the phase difference between the signal output from the corresponding mixer 34 and carrier signal. For example, each variable delay section 36 may delay the signal output from the corresponding mixer 34 so that the signals output from all the mixers 34 are substantially synchronized to each other. In other words, each variable delay section 36 may delay the signal output from the corresponding mixer 34 so that the phase "0" timings of the signals output from all the mixers 34 are substantially the same.

In addition, the time delay of each variable delay section 36 may be adjusted in advance so tat the signals output from all the mixers 34 are substantially synchronized to each other and the relative phase difference between these signals and carrier signal takes on a predetermined value. If it is not required to form a certain relation between the phase of the carrier signal and the phase of the jitter signals, any one of the variable delay sections 36 may be omitted.

Each of the amplitude control sections 38 adjusts the amplitude of the signal output from a corresponding one of the mixers 34. Each amplitude control section 38 may receive the signal via a corresponding one of the variable delay sections 36, or output the signal whose amplitude has been adjusted to the adding section 12 via the corresponding variable delay section 36. As described above with reference to FIG. 3, each amplitude control section 38 controls the amplitude ratio between the carrier signal input into the adding section 12 and a corresponding pair of the first and second jitter signals in accordance with the amplitude β of to jitter to be injected.

For example, when jitter having an amplitude of 1 rad$_{p-0}$ in terms of the phase is injected, the amplitude control sections 38 may control the amplitudes of the corresponding signals so that the ratio among the amplitude of the carrier signal, the amplitude of the first-order first jitter signal ($f_c+f_m$) and first-order second jitter signal ($f_c-f_m$), and the amplitude of the second-order first jitter signal ($f_c+2f_m$) and second-order second jitter signal ($f_c-2f_m$) becomes equal to $J_0(\beta):J_1(\beta):J_2(\beta) =a_1:a_2:a_3$ (note that β=1) as indicated by FIG. 3. In this case, if the jitter injection circuit 100 includes therein one or more combination circuits of the third order and higher, the amplitude control sections 38 of the third order and higher each may adjust the amplitude of the corresponding first and second jitter signals to be substantially zero, and output the resulting signal to the adding section 12.

The jitter injection circuit 100 may include therein one or more combination circuits the number of which is determined in accordance with the range of the amplitude of the jitter to be injected. This configuration may be accomplished in the following manner. For example, the maximum value of the amplitude of the jitter to be injected is assigned to the Bessel function of each order, and it is then identified the Bessel functions of which order show values equal to or higher than a predetermined value. Among the identified orders, the highest order is selected. Based on this selection, the jitter injection circuit 100 may include therein one or more combination circuits of the first order to the order selected (each combination circuit is constituted by the local oscillator 32, mixer 34, variable delay section 36 and amplitude control section 38). Here, the predetermined value may be set by a user in advance in accordance with the accuracy requirement for the jitter. Specifically speaking, if the amplitude of the jitter to be injected falls within the range from 0 rad$_{p-0}$ to 1 rad$_{p-0}$, the values of the Bessel functions of the third order and higher are sufficiently small as shown in FIG. 3. Accordingly, the jitter injection circuit 100 may only include therein first-order and second-order combination circuits.

The adding section 12 adds together the first-order to N-th-order pairs of first and second jitter signals and carrier signal, to generate the output signal. Here, N may take on an integer value the upper limit of which is equal to the number of combination circuits which are capable of being provided in parallel. Configured in the above-described manner, the jitter injection circuit 100 can generate the output signal including jitter having a larger amplitude injected thereto.

Figure 7:
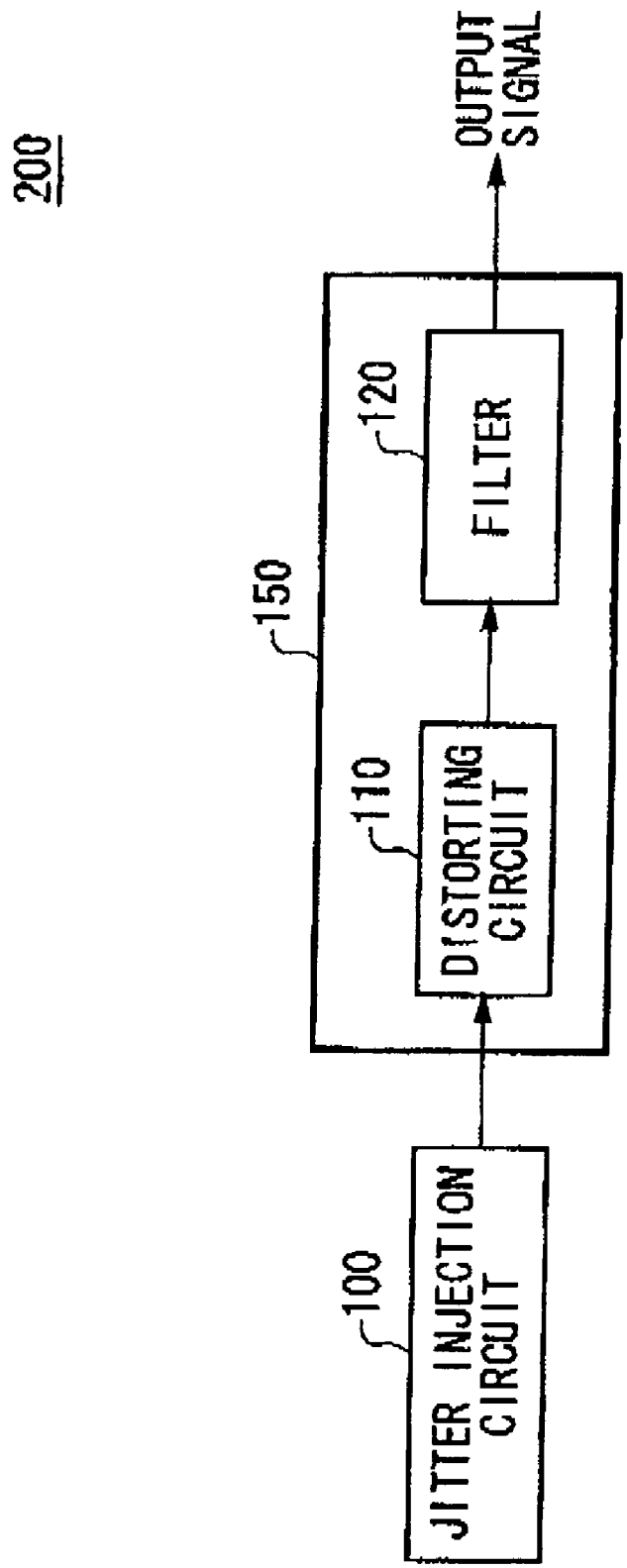
FIG. 7 shows one example of the configuration of a signal generation circuit 200 relating to one embodiment of the present invention.

FIG. 7 shows one example of the configuration of a signal generation circuit 200 relating to one embodiment of the present invention. The signal generation circuit 200 includes therein the jitter injection circuit 100 and a jitter amplifier circuit 150. The jitter injection circuit 100 generates a signal including jitter injected thereto. The jitter amplifier circuit 150 receives the signal output from the jitter injection circuit 100, amplifies the jitter, and outputs the resultant signal. The jitter injection circuit 100 may have the same configuration and function as the jitter injection circuits 100 described with reference to FIGS. 1 to 6. However, it should be noted that in the present embodiment the jitter injection circuit 100 does not need to inject jitter having a large amplitude since the signal generation circuit 200 amplifies the jitter injected by the jitter injection circuit 100. In other words, the jitter injection circuit 100 may not need to be configured in such a manner that a plurality of combination circuits are provided in parallel as shown in FIG. 6. For example, the jitter injection circuit 100 may inject jitter based only on the fist-order first and second jitter signals as shown in FIGS. 1 to 5. In this way, the circuit scale of the jitter injection circuit 100 can be reduced.

The jitter amplifier circuit 150 includes therein a distorting circuit 110 and a filter 120. The distorting circuit 110 receives the signal output from the jitter injection circuit 100, and distorts the waveform of the received signal so as to generate at least a harmonic component for the signal. For example, the distorting circuit 110 may include therein a p-th power circuit that raises the received signal to the p-th power, and outputs the resultant signal (note that p is an integer of two or more).

The filter 120 receives the distorted signal output from the distorting circuit 110, and passes a harmonic component of a predetermined order, to generate the output signal. For example, the filter 120 may pass a harmonic component of the n-th order (here, n is an integer no less than two and no more than p) which is determined in accordance with the amount of jitter to be included in the output signal. To be more specific, the filter 120 may extract a harmonic component of a certain order which is determined in advance in accordance with the ratio of amplifying the jitter. For example, when the jitter amplifier circuit 150 amplifies the jitter injected by the jitter injection circuit 100 five times, the filter 120 extracts and outputs a harmonic component of the fifth order. Here, the distorting circuit 110 distorts the received signal so that at least the fifth harmonic component is generated. For example, the distorting circuit 110 may raise the received signal to the fifth or higher power, and output the resultant signal.

Configured in the above-described manner, the signal generation circuit 200 can generate the output signal including jitter having a high frequency and a large amplitude injected thereto, with it being possible to achieve a small circuit scale. The following describes how the jitter amplifier circuit 150 shown in FIG. 7 can amplify the jitter.

For example, when a sinusoidal signal is distorted, second, third, . . . harmonics are generated which respectively have frequencies equal to integral multiples of the carrier frequency of the sinusoidal signal. Here, the jitter included in the sinusoidal signal is duplicated in the sideband of each harmonic. Since the spectrum of the jitter component is duplicated without a change, the radian amplitude of the jitter component is increased two times, three times, . . . in the second, third, . . . harmonics. For this reason, the jitter amplifier circuit 150 shown in FIG. 7 can generate jitter having an n-times-amplified radian amplitude, by distorting the signal and extracting the n-th harmonic.

The jitter amplifier circuit 150 includes an n-th power circuit as the distorting circuit 110, for example. In this case, the following expression represents a signal generated by raising, to the n-th power, the signal obtained by injecting a sinusoidal jitter having a radian amplitude of β(β cos(2πf$_m$t)) to a sinusoidal signal cos(2πf$_c$t) (here, n is an even number, that is to say, n=2 m when m is an integer).

$$\cos^{2m}(2\pi f_C t + \beta \cos(2\pi f_m t)) = \frac{{}_{2m}C_m}{2^{2m}} + \qquad \text{Expression (7)}$$

$$\frac{1}{2^{2m-1}} \sum_{k=0}^{m-1} {}_{2m}C_{2m-k} \cos(2(m-k)(2\pi f_C t + \beta \cos(2\pi f_m t)))$$

When n is an odd number (n=2m+1), the signal generated by raising the original signal to the n-th power is represented by the following expression.

$$\cos^{2m+1}(2\pi f_C t + \beta \cos(2\pi f_m t)) = \frac{1}{2^{2m}} \qquad \text{Expression (8)}$$

$$\sum_{k=0}^{m} {}_{2m+1}C_{2m+1-k} \cos(2(m-k+1)(2\pi f_C t + \beta \cos(2\pi f_m t)))$$

The expressions (7) and (8) tell that even-number-th (second, forth, sixth, ... 2m-th) harmonics are produced when the signal is raised to the 2m-th power, and odd-number-th (third, fifth, seventy ... (2m+1)-th) harmonics are produced when the signal is raised to the (2m+1)-th power.

As indicated by the expression (7), the jitter component of the 2(m−k)-th harmonic has a radian amplitude of 2(m−k)β, which is 2(m−k) times. Similarly, as indicated by the expression (8), the jitter component of the 2(m−k+1)-th harmonic has a radian amplitude of 2(m−k+1)β, which is 2(m−k+1) times. Consequently, the jitter amplifier circuit 150 shown in FIG. 7 can generate jitter having an n-times-amplified radian amplitude by distorting the signal and extracting the n-th harmonic.

In the present embodiment, the distorting circuit 110 is constituted by using the n-th power circuit, as an example. However, the distorting circuit 110 is not limited to the n-th power circuit. The distorting circuit 110 can be constituted by using any circuit which is capable of generating a harmonic component of a signal supplied thereto. For example, the distorting circuit 110 may be a circuit which converts a sine curve input thereto into a rectangular wave, and outputs the rectangular wave. For example, the distorting circuit 110 may be a circuit which outputs a rectangular wave in synchronization with the timing at which the input sine curve reaches a predetermined level. More specifically, the distorting circuit 110 may be a comparator, an inverter, a buffer or the like. The distorting circuit 110 maybe a circuit which outputs an L level when the level of the input signal is lower than a predetermined reference value, and outputs an H level when the level of the input signal is equal to or higher than the reference value.

For example, the distorting circuit 110 outputs a rectangular waveform $p(2\pi f_c t + \beta \cos(2\pi f_m t))$ having an amplitude A and a frequency $f_c$. The following shows the result of subjecting this signal to Fourier series expansion.

$$p(2\pi f_C t + \beta \cos(2\pi f_m t)) = \qquad \text{Expression (9)}$$

$$\frac{4A}{\pi} \sum_{k=1}^{\infty} \frac{1}{2k-1} \sin((2k-1)(2\pi f_C t + \beta \cos(2\pi f_m t)))$$

As indicated by the expression (9), when the distorting circuit 110 is a circuit for converting a sine curve into a rectangular wave, the output from the distorting circuit 110 includes an odd-number-th ((2k−1)-th) harmonic generated.

Here, the jitter component of the (2k−1)-th harmonic has a radian amplitude (2k−1)β, which is (2k−1) times.

As discussed above, the distorting circuit 110 can be constituted by using a variety of circuits. Other than the foregoing examples, the distorting circuit 110 can be constituted by using any circuit which is capable of distorting an input signal so as to generate at least a harmonic component, such as an exponential circuit which subjects the input level to exponential transformation and outputs the result and an LOG circuit which subjects the input level to logarithmic transformation and outputs the result.

Figure 8A:
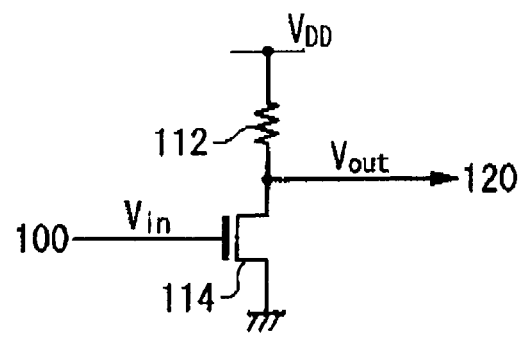
FIG. 8A shows one example of the configuration of a distorting circuit 110.

FIG. 8A shows one example of the configuration of the distorting circuit 110. According to the present embodiment, the distorting circuit 110 is a second-power circuit which raises the input signal to the second power and outputs the resultant signal. The distorting circuit 110 includes therein a resistance 112 and a transistor 114. The drain terminal of the transistor 114 is connected to the positive power supply wire VDD via the resistance 112. The source terminal of the transistor 114 is grounded. The gate terminal of the transistor 114 is supplied with the signal output from the jitter injection circuit 100.

The transistor 114 is a transistor configured so as to operate in a saturation region when input with the signal output from the jitter injection circuit 100. Here, the saturation region is such a region that $V_{GS}$ is larger than $V_{DS}+V_{th}$, where $V_{DS}$ denotes the drain-source voltage of the transistor 114, $V_{GS}$ denotes the gate-source voltage of the transistor 114, and $V_{th}$ denotes a threshold voltage.

For example, the transistor 114 may be supplied with the power supply voltage VDD which enables the transistor 114 to operate in the saturation region. The signal at the drain terminal of the transistor 114 is supplied to the filter 120. Configured in the above-described manner, the distorting circuit 110 can raise the signal output from the jitter injection circuit 100 to the second power, and output the resultant signal.

Figure 8B:
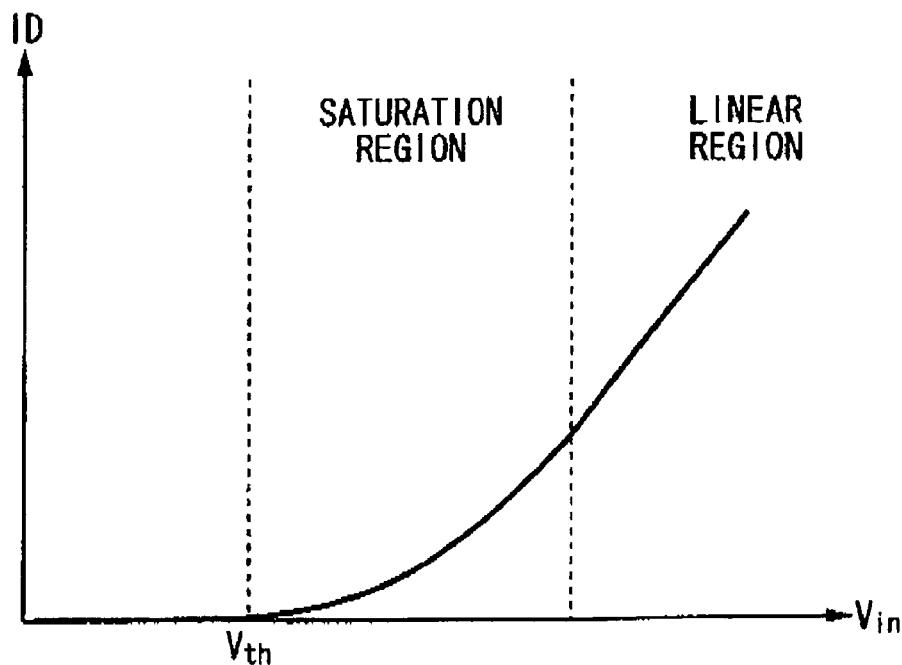
FIG. 8B shows one example of the input voltage-drain current characteristics of a transistor 114.

FIG. 8B shows one example of the input voltage-drain current characteristics of the transistor 114. As shown in FIG. 8B, the transistor 114 shows characteristics of a quadratic curve in the saturation region. Since the transistor 114 operates in the saturation region, the distorting circuit 110 can raise the input signal to the second power and output the resultant signal. Alternatively, the distorting circuit 110 may be configured in such a manner that a plurality of second-power circuits shown in FIG. 8A are cascaded.

Figure 9A:
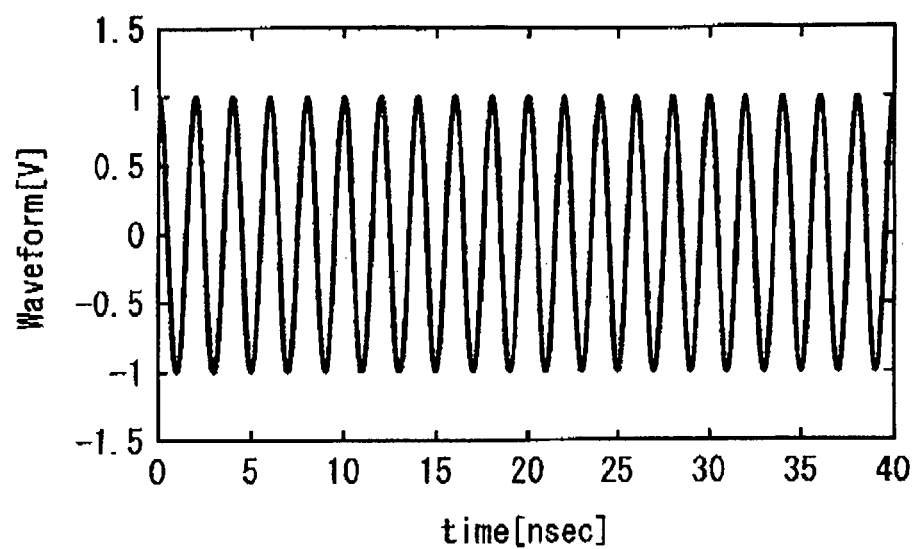
FIG. 9A shows one example of the waveform of a signal output from the jitter injection circuit.
Figure 9B:
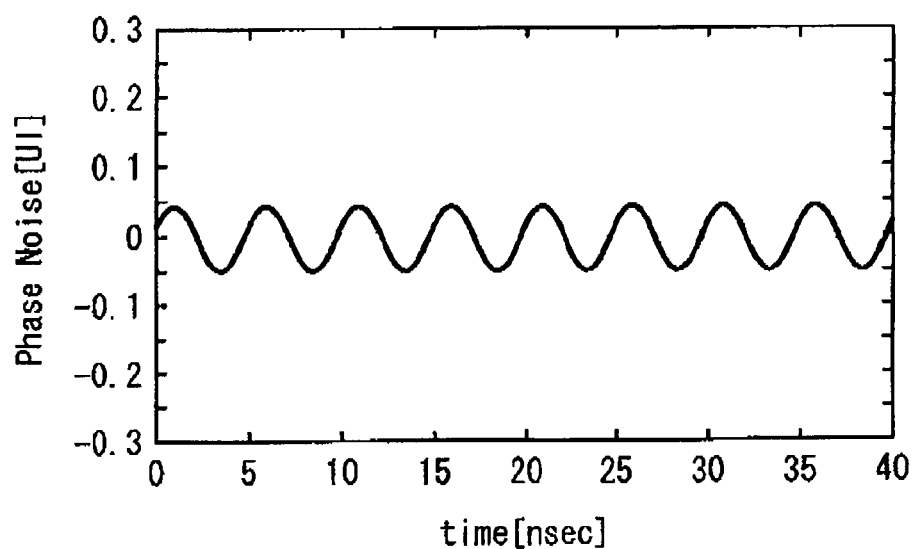
FIG. 9B shows one example of the waveform of jitter included in the signal shown in FIG. 9A.

FIG. 9A shows one example of the waveform of the signal output from the jitter injection circuit 100. FIG. 9B shows one example of the waveform of jitter included in the signal shown in FIG, 9A. According to the present embodiment, the jitter injection circuit 100 generates a signal which has a carrier frequency of 500 MHz, a jitter frequency of 200 MHz, and a jitter amplitude of 0.1 UIpp.

In this case, the carrier output section 10 outputs a sine curve having a frequency of 500 MHz. The jitter output section 20 outputs a first jitter signal having a frequency of 700 MHz and an amplitude of $J_1(0.1\pi)$ and a second jitter signal having a frequency of 300 MHz and an amplitude of $J_{-1}(0.1\pi)$. The adding section 12 adds together these signals, and outputs the result of the addition. In his way, the signal shown in FIG. 9A is obtained. Note that the signal includes the jitter which is shown in FIG. 9B injected thereto.

Figure 10A:
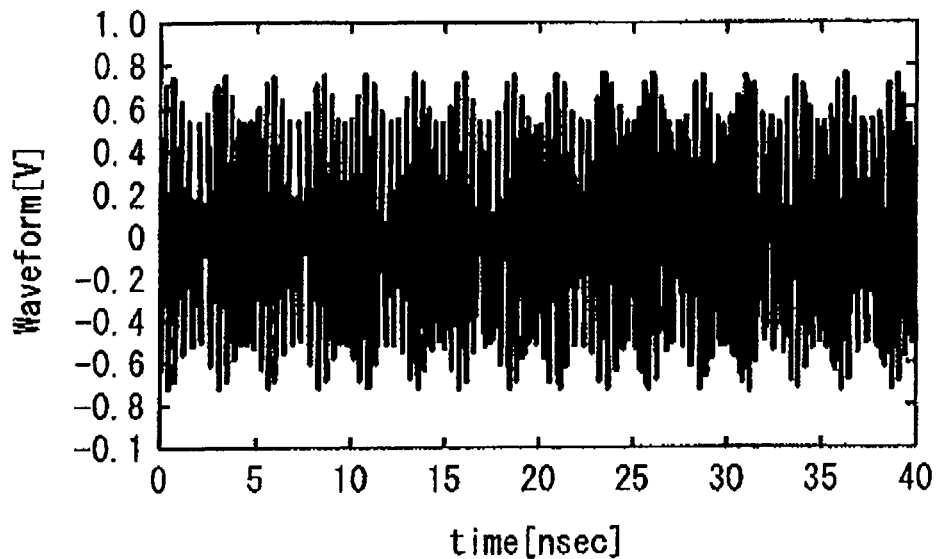
FIG. 10A shows one example of the waveform of a signal obtained by raising the signal shown in FIG. 9A to the fifth power.

FIG. 10A shows one example of the waveform of the signal obtained by raising the signal shown in FIG. 9A to the fifth power. The distorting circuit 110 relating to the present embodiment raises the signal output from the jitter injection circuit 100 to the fifth power and outputs the resultant signal.

The filter 120 then extracts the fifth harmonic component from the signal output from the distorting circuit 110, and outputs the extracted fifth harmonic component. The filter 120 may pass signal components of 2 GHz to 3 GHz, for example. The signal shown in FIG. 10A has a variation in amplitude. The distorting circuit 110 may use a limiting amplifier or the like to reduce the variation in signal amplitude. The limiting amplifier may convert a signal level which is equal to or higher than a predetermined value into a signal level of the predetermined value, and outputs the resultant signal, for example.

Figure 10B:
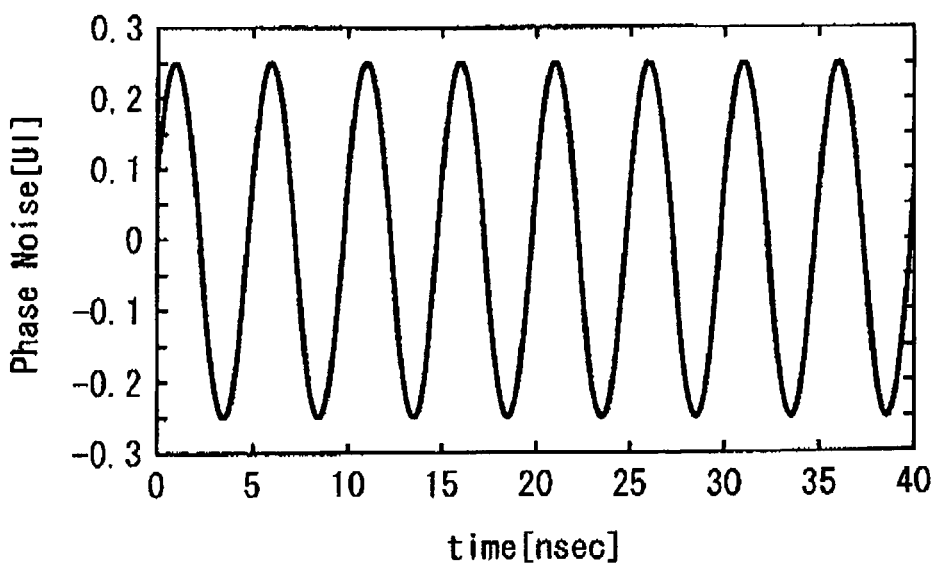
FIG. 10B shows one example of the waveform of jitter included in the signal output from a filter 120.

FIG. 10B shows one example of the waveform of the jitter included in the signal output from the filter 120. The above-mentioned operation can produce jitter having a radian amplitude five times the radian amplitude of the jitter shown in FIG. 9B. Here, the signal output from the filter 120 has a carrier frequency five times the original carrier frequency of 500 MHz. Therefore, it is preferable that the carrier signal output from the carrier output section 10 has a frequency equal to one n-th of the carrier frequency to be possessed by the signal output from the signal generation circuit 200 (here, n indicates the order of the harmonic extracted by the filter 120 and in the present embodiment n=5).

Figure 11:
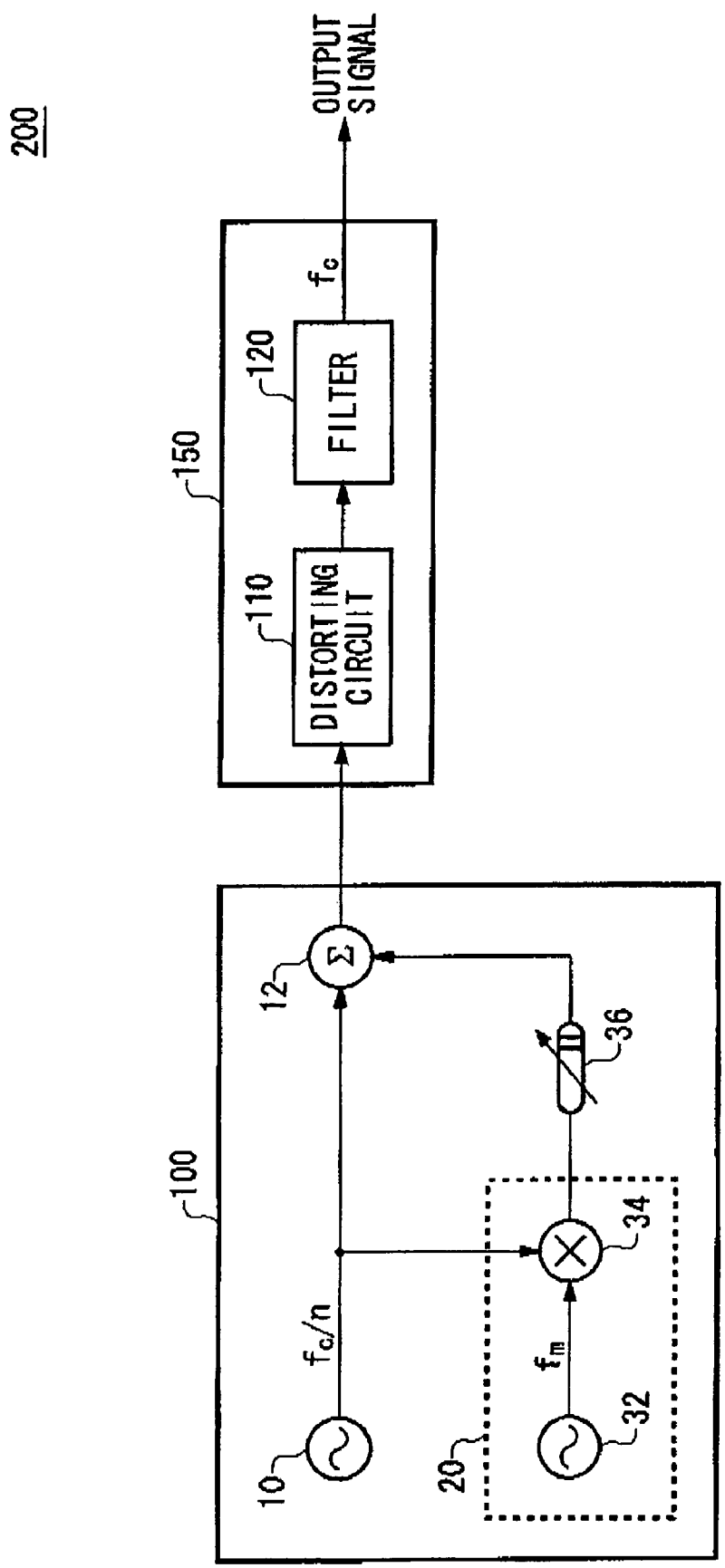
FIG. 11 is used to explain one example of the operation of the signal generation circuit 200.

FIG. 11 is used to explain one example of the operation of the signal generation circuit 200. According to the present embodiment, the carrier output section 10 outputs a carrier signal having a frequency equal to one n-th of the carrier frequency $f_c$ to be possessed by the signal output from the signal generation circuit 200. Here, n is an integer corresponding to the order of the harmonic component extracted by the filter 120. For example, when the signal output from the signal generation circuit 200 is supposed to have a carrier frequency of 2.5 GHz and the filter 120 extracts the fifth harmonic component, the carrier signal output from the carrier output section 10 has a frequency of 2.5 GHz/5=500 MHz.

The jitter output section 20 outputs a first jitter signal (having a frequency of $(f_c/n)+f_m$) and a second jitter signal (having a frequency of $(f_c/n)-f_m$) which are obtained by adding or subtracting the jitter frequency $f_m$ to be possessed by the jitter to/from the frequency equal to one n-th of the carrier frequency.

The adding section 12 adds together the carrier signal, first jitter signal and second jitter signal, and outputs the resultant signal. The distorting circuit 110 distorts the signal output from the adding section 12 to at least generate an n-th harmonic.

The filter 120 extracts the n-th harmonic component from the distorted signal output from the distorting circuit 110, and outputs the n-th harmonic component; Consequently, the signal output from the filter 120 has a carrier frequency of $f_c$ and includes jitter having a radian amplitude of no as mentioned above.

Figure 12:
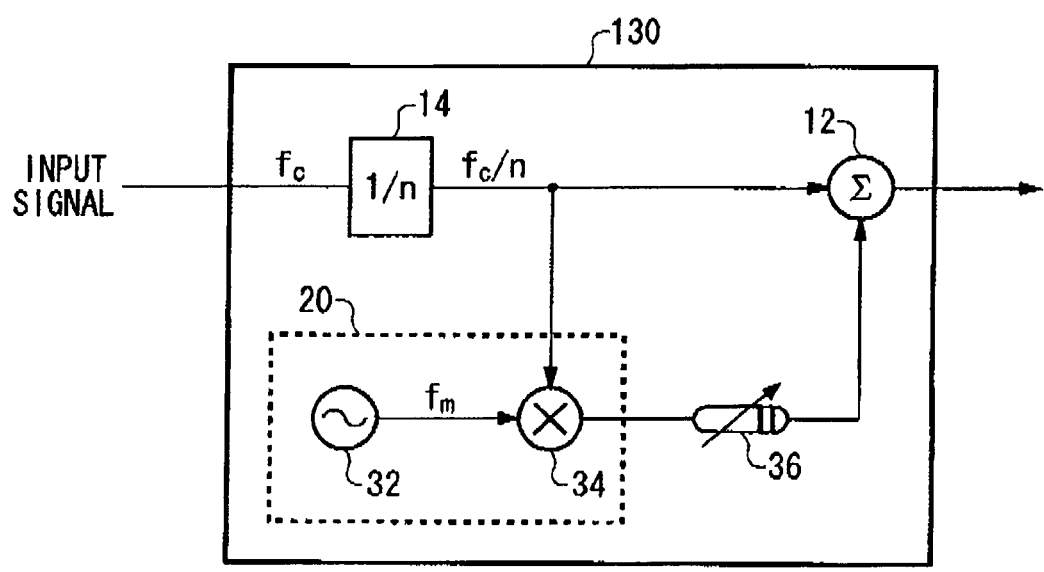
FIG. 12 shows another example of the configuration of the jitter injection circuit 100.

FIG. 12 shows another example of the configuration of the jitter injection circuit 100. According to the present embodiment, the jitter injection circuit 100 injects jitter into an input signal supplied thereto and outputs the resultant signal. The jitter injection circuit 100 relating to the present embodiment is configured by replacing the carrier output section 10 with a frequency converting section 14 in the jitter injection circuit 100 shown in one of FIGS. 4 to 6. The frequency converting section 14 converts the frequency of the input signal to one n-th frequency, and outputs the resultant signal. For example, the frequency converting section 14 may be a frequency divider or the like.

The signal output from the frequency converting section 14 corresponds to the carrier signal mentioned with reference to FIGS. 1 to 11 Therefore, the mixer 34 receives the signal which is output from the frequency converting section 14 and split, multiplies together the received signal and local signal, and outputs the result of the multiplication. The adding section 12 adds together the signal output from the frequency converting section 14 and the signal output from the jitter output section 20.

By using the jitter injection circuit 100 shown in FIG. 12 as the jitter injection circuit 100 of the signal generation circuit 200 described with reference to FIG. 11, the signal generation circuit 200 can inject jitter having a high frequency and a large amplitude to the input signal supplied thereto, with ease and a small-sized circuit.

The jitter injection circuit 100 described above may be provided on a single semiconductor chip. Furthermore, the jitter amplifier circuit 150 may be provided on a single semiconductor chip, and the signal generation circuit 200 may be provided on a single semiconductor chip.

According to the foregoing description, the jitter amplifier circuit 150 has the jitter injection circuit 100 at the preceding stage. However, the preceding stage of the jitter amplifier circuit 150 is not limited to the jitter injection circuit 100. The jitter amplifier circuit 150 can be utilized independently of the jitter injection circuit 100. In other words, the jitter amplifier circuit 150 can amplify the jitter of any input signal and output the resultant signal.

Figure 13:
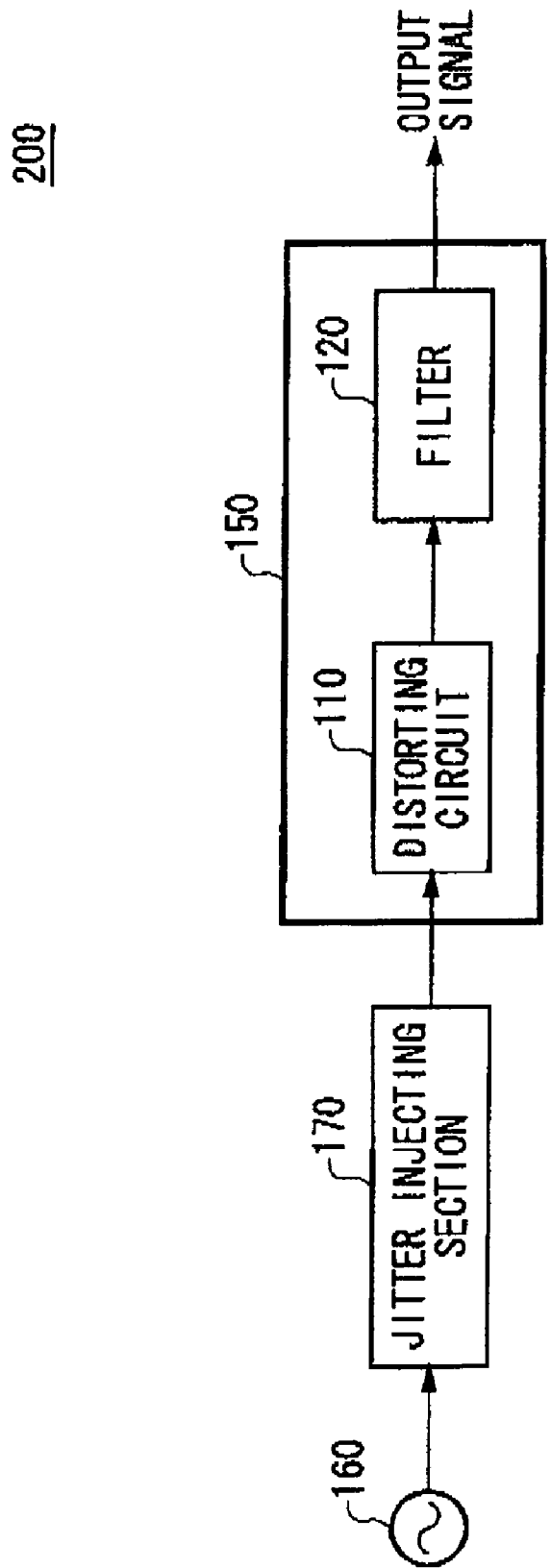
FIG. 13 shows another example of the configuration of the signal generation circuit 200.

FIG. 13 shows another example of the configuration of the signal generation circuit 200. According to the present embodiment, the signal generation circuit 200 includes therein a reference signal generating section 160, a jitter injecting section 170, and the jitter amplifier circuit 150.

The reference signal generating section 160 generates a reference signal having a predetermined frequency. For example, the reference signal generating section 160 may generate and output a sine curve having a frequency equal to one n-th of the carrier frequency to be possessed by the signal output from the signal generation circuit 200.

The jitter injecting section 170 injects jitter into the signal output from the reference signal generating section 160. Here, the jitter injected by the jitter injecting section 170 to the signal output from the reference signal generating section 160 has a frequency substantially the same as the frequency of the jitter to be included in the signal output from the signal generation circuit 200. In addition, the jitter injected by the jitter injecting section 170 has an amplitude equal to one n-th of the amplitude of the jitter to be included in the signal output from the signal generation circuit 200.

For example, the jitter injecting section 170 may include therein a delay circuit which delays the signal output from the reference signal generating section 160. In this case, the jitter injecting section 170 may inject jitter by controlling the time delay of the delay circuit in accordance with the jitter to be injected.

When the reference signal generating section 160 is a voltage-controlled oscillator, the jitter injecting section 170 may inject jitter by controlling the control voltage of the voltage-controlled oscillator in accordance with the jitter to be injected.

Note that the configurations of the reference signal generating section 160 and jitter injecting section 170 are not limited to the configurations described above. The reference signal generating section 160 and jitter injecting section 170 may be obtained based on a known configuration to inject jitter into a signal.

The jitter amplifier circuit 150 may have the same configuration and function as the jitter amplifier circuit 150 described with reference to FIGS. 7 to 12. The jitter amplifier circuit 150 amplifies the jitter injected to the reference signal n times and outputs the result of the amplification. To be specific, the filter 120 extracts an n-th harmonic component from the signal output from the distorting circuit 110 and outputs the extracted harmonic component.

The jitter injecting section 170 can easily inject jitter since the jitter injecting section 170 is only required to inject jitter into the reference signal having a frequency equal to one n-th of the carrier frequency to be possessed by the signal output from the signal generation circuit 150, and the jitter injecting section 170 is only required to inject jitter having an amplitude equal to one n-th of the amplitude of the jitter to be included to the signal output from the signal generation circuit 150.

Configured in the above-described manner, the signal generation circuit 200 can easily generate the output signal which has a high frequency and includes jitter having a large amplitude injected-thereto.

In the foregoing description, the jitter to be amplified is sinusoidal jitter, but not limited thereto. The jitter amplifier circuit 150 may amplify random jitter, rectangular jitter, triangular jitter or other jitter having any waveform in terms of time, for example.

Figure 14:
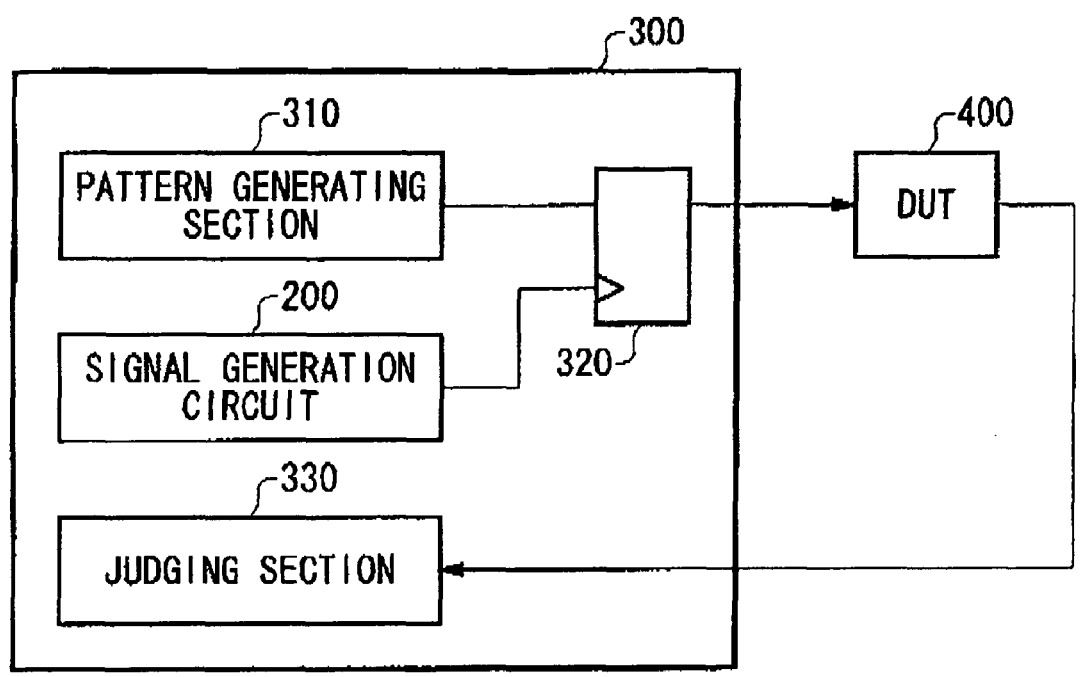
FIG. 14 shows one example of the configuration of a test apparatus 300 relating to another embodiment of the present invention.

FIG. 14 shows one example of the configuration of a test apparatus 300 relating to a different embodiment of the present invention. The test apparatus 300 tests a device under test 400 such as a semiconductor circuit. The test apparatus 300 includes therein a pattern generating section 310, the signal generation circuit 200, a waveform shaping section 320, and a judging section 330. The device under test 400 may be a device such as a receiver used for serial communication and the like, for example, The pattern generating section 310 generates a predetermined logic pattern. For example, the pattern generating section 310 may generate a logic pattern which is determined in advance by a user or the like, or generate a logic pattern at random.

The signal generation circuit 200 generates a clock signal including jitter injected thereto. The signal generation circuit 200 may have the same function and configuration as the signal generation circuit 200 described with reference to FIGS. 1 to 13.

The waveform shaping section 320 generates a test signal by sampling the logic pattern supplied from the pattern generating section 310 in accordance with the clock signal supplied from the signal generation circuit 200. In this way, the waveform shaping section 320 can generate a test signal including jitter injected thereto. The waveform shaping section 320 inputs the generated test signal into the device under test 400.

The judging section 330 judges the acceptability of the device under test 400 based on a to-be-measured signal output from the device under test 400 in response to the test signal. For example, the judging section 330 may make the judgment whether the device under test 400 is acceptable by determining whether the logic-pattern of the to-be-measured signal matches a predetermined expected value pattern.

Here, the judging section 330 may set the amount of jitter injected by the signal generation circuit 200 to different values, and compare the logic pattern of the to-be-measured signal with the expected value pattern, for each value of the amount of jitter. By performing this operation, the test apparatus 300 can measure jitter tolerance of the device under test 400. To put it differently, the test apparatus 300 can measure the limit of the jitter amount which enables the device under test 400 to operate normally. The judging section 330 may make the judgment whether the device under test 400 is acceptable by determining whether the measured jitter tolerance falls within a predetermined range.

In the present embodiment the test apparatus 300 includes therein the signal generation circuit 200. However, the test apparatus 300 may include therein one of the jitter injection circuit 100 and jitter amplifier circuit 150 in place of the signal generation circuit 200. For example, the jitter injection circuit 100 described with reference to FIGS. 1 to 5 may be utilized when jitter having a small amplitude is to be injected. Meanwhile, the jitter injection circuit 100 described with reference to FIG. 6 may be utilized when jitter having a large amplitude is to be injected. The jitter amplifier circuit 150 described with reference to FIG. 12 may be utilized when a clock signal including jitter injected thereto is supplied.

In the present embodiment, the clock signal supplied to the waveform shaping section 320 includes jitter injected thereto. In other embodiments, however, the clock signal supplied to the judging section 330 may include jitter injected thereto. For example, the judging section 330 may perform sampling on the to-be-measured signal in accordance with the clock signal.

As clearly indicated by the above description, an embodiment of the present invention can easily amplify jitter having a high frequency with it being possible to achieve a small circuit scale.

While the embodiments of the present invention have been described, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

What is claimed is:

1. A jitter amplifier circuit for amplifying jitter included in an input signal, comprising: a distorting circuit that receives the input signal, and distorts a waveform of the input signal so as to generate a distorted signal having at least a harmonic component of the input signal; and a filter constructed and arranged to filter the distorted signal and pass only a harmonic component of a certain order which is determined in accordance with an amplification ratio, related to a radian amplitude, of the jitter amplifier circuit.

2. The jitter amplifier circuit as set forth in claim 1, wherein, the distorting circuit includes an n-th power circuit (n is an integer of two or more) that raises the input signal to the n-th power which is determined in accordance with the amplification ratio of the jitter amplifier circuit, and the filter passes an n-th harmonic component of the distorted signal.

3. The jitter amplifier circuit as set forth in claim 1, wherein, the input signal has a sine shape, and the distorting circuit outputs a rectangular wave in synchronization with a timing at which the input signal reaches a predetermined level.

4. A signal generation circuit for generating an output signal including jitter injected thereto, comprising: a reference signal generating section that generates a reference signal; a jitter injecting section that injects jitter into the reference signal output from the reference signal generating section; and a jitter amplifier circuit that receives the reference signal including the jitter injected thereto by the jitter injecting section, and amplifies the jitter included in the reference signal, wherein the jitter amplifier circuit includes: a distorting circuit that receives the reference signal including the jitter injected thereto by the jitter injecting section, and distorts a waveform of the received reference signal so as to generate a distorted signal having at least a harmonic component of the reference signal; and a filter constructed and arranged to filter the distorted signal and pass only a harmonic component of a certain order which is determined in accordance with an amplification ratio, related to a radian amplitude, of the jitter amplifier circuit.

5. The signal generation circuit as set forth in claim 4, wherein, the filter passes an n-th harmonic component (n is an integer of two or more) of the distorted signal, and the reference signal generating section generates the reference signal having a frequency equal to one n-th of a frequency of the output signal.

6. A semiconductor chip for amplifying jitter of an input signal, comprising: a distorting circuit that receives the input signal, and distorts a waveform of the input signal so as to generate a distorted signal having at least a harmonic component of the input signal; and a filter, constructed and arranged to filter the distorted signal and pass only a harmonic component of a certain order which is determined in accordance with an amplification ratio, related to a radian amplitude, of the amplifying circuit.

7. A test apparatus for testing a device under test, comprising: a pattern generating section that generates a predetermined logic pattern; a signal generation circuit that generates a clock signal including jitter injected thereto; a waveform shaping section that generates a test signal by sampling the logic pattern in accordance with the clock signal, and inputs the generated test signal into the device under test; and a judging section that judges acceptability of the device under test based on a to-be-measured signal output from the device under test in response to the test signal, wherein the signal generation circuit includes: a reference signal generating section that generates a reference signal; a jitter injecting section that injects jitter to the reference signal output from the reference signal generating section; and a jitter amplifier circuit that receives the reference signal including the jitter injected thereto by the jitter injecting section, the jitter amplifier circuit including: a distorting circuit that receives the reference signal including the jitter injected thereto by the jitter injecting section, and distorts a waveform of the received reference signal so as to generate a distorted signal having at least a harmonic component of the reference signal; and a filter, constructed and arranged to filter the distorted signal and pass only a harmonic component of a certain order which is determined in accordance with an amplification ratio, related to a radian amplitude, of the jitter amplifier circuit, so as to generate the clock signal.

\* \* \* \* \*